(12) United States Patent
Holmes

(10) Patent No.: US 8,211,596 B2
(45) Date of Patent: *Jul. 3, 2012

(54) OPTICALLY VARIABLE SECURITY DEVICE

(75) Inventor: Brian William Holmes, Fleet (GB)

(73) Assignee: De La Rue International Ltd., Basingstoke (GB)

( * ) Notice: Subject to any disclaimer, the term of this patent is extended or adjusted under 35 U.S.C. 154(b) by 1028 days.

This patent is subject to a terminal disclaimer.

(21) Appl. No.: 12/087,513

(22) PCT Filed: Jan. 19, 2007

(86) PCT No.: PCT/GB2007/000176
§ 371 (c)(1),
(2), (4) Date: Jul. 9, 2008

(87) PCT Pub. No.: WO2007/083140
PCT Pub. Date: Jul. 26, 2007

(65) Prior Publication Data
US 2009/0004571 A1    Jan. 1, 2009

(30) Foreign Application Priority Data
Jan. 19, 2006  (GB) .................................. 0601093.8

(51) Int. Cl.
*G03F 7/00*    (2006.01)

(52) U.S. Cl. ........................................... 430/2; 430/312

(58) Field of Classification Search .................. None
See application file for complete search history.

(56) References Cited

U.S. PATENT DOCUMENTS

| 6,255,038 B1 | 7/2001 | Hobbs |
| 2004/0009406 A1 | 1/2004 | Hesselink et al. |
| 2005/0088633 A1 | 4/2005 | Borodovsky |
| 2006/0141385 A1 | 6/2006 | Kaule |
| 2010/0172000 A1* | 7/2010 | Holmes ........................... 359/2 |

FOREIGN PATENT DOCUMENTS

| WO | WO 92/04692 A1 | 3/1992 |
| WO | WO 00/13916 A1 | 3/2000 |
| WO | WO 2004/077493 A2 | 9/2004 |
| WO | WO 2006/077445 A2 | 7/2006 |

OTHER PUBLICATIONS

Handbook of Microlithography, Micromachining, and Microfabrication, vol. 1: Microlithography, 1997, pp. 204-212.

* cited by examiner

*Primary Examiner* — Cynthia Kelly
*Assistant Examiner* — Anna Verderame

(57) ABSTRACT

A method of forming a security device comprises:
  a) providing an undeveloped photoresist layer on an electrically conductive layer;
  b) forming a first diffractive pattern in the undeveloped photoresist layer using optical-interferometry;
  c) forming a second diffractive pattern in the undeveloped photoresist layer using electron beam lithography; and
  d) thereafter developing the photoresist layer.

25 Claims, 16 Drawing Sheets

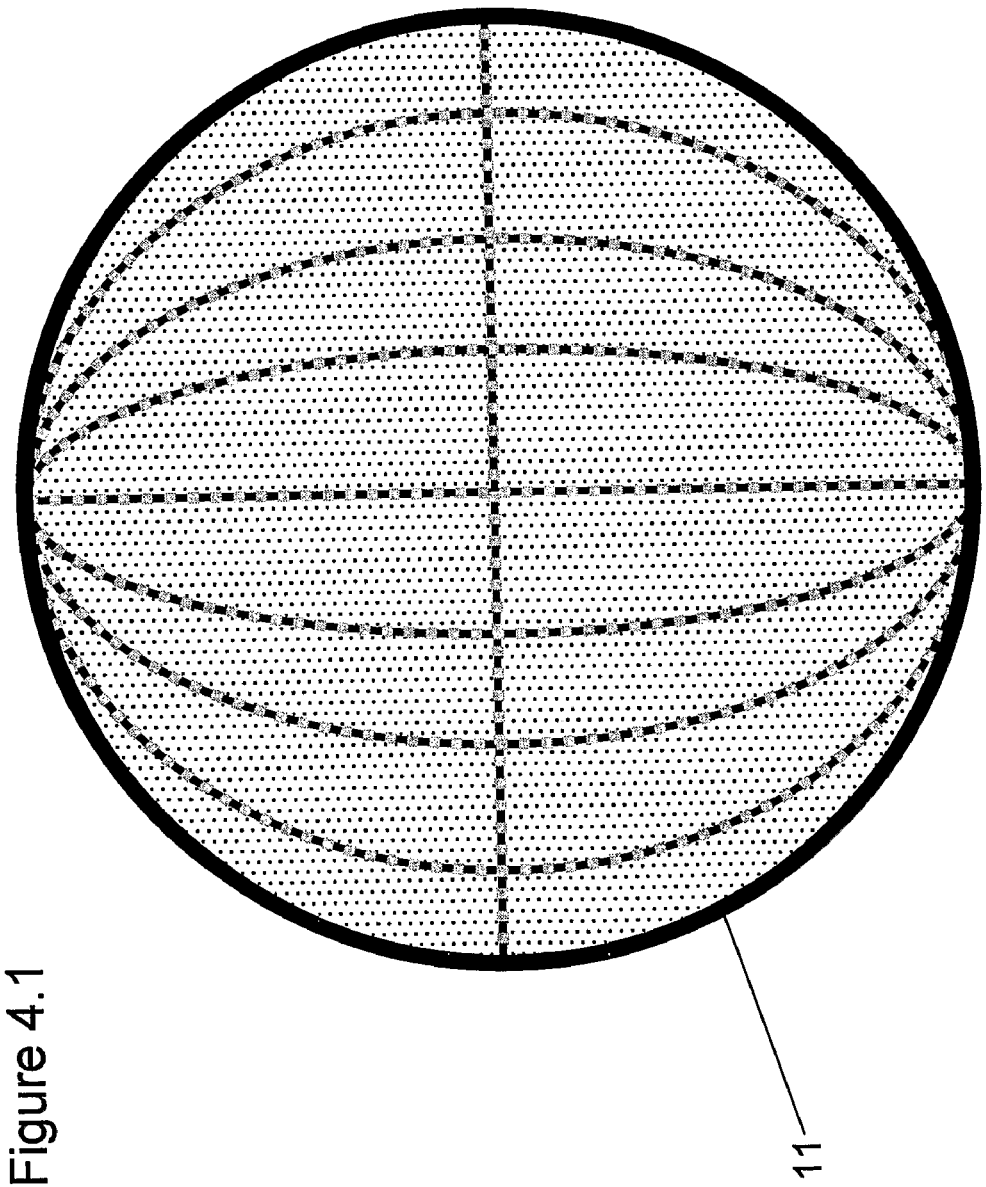
Figure 4.1

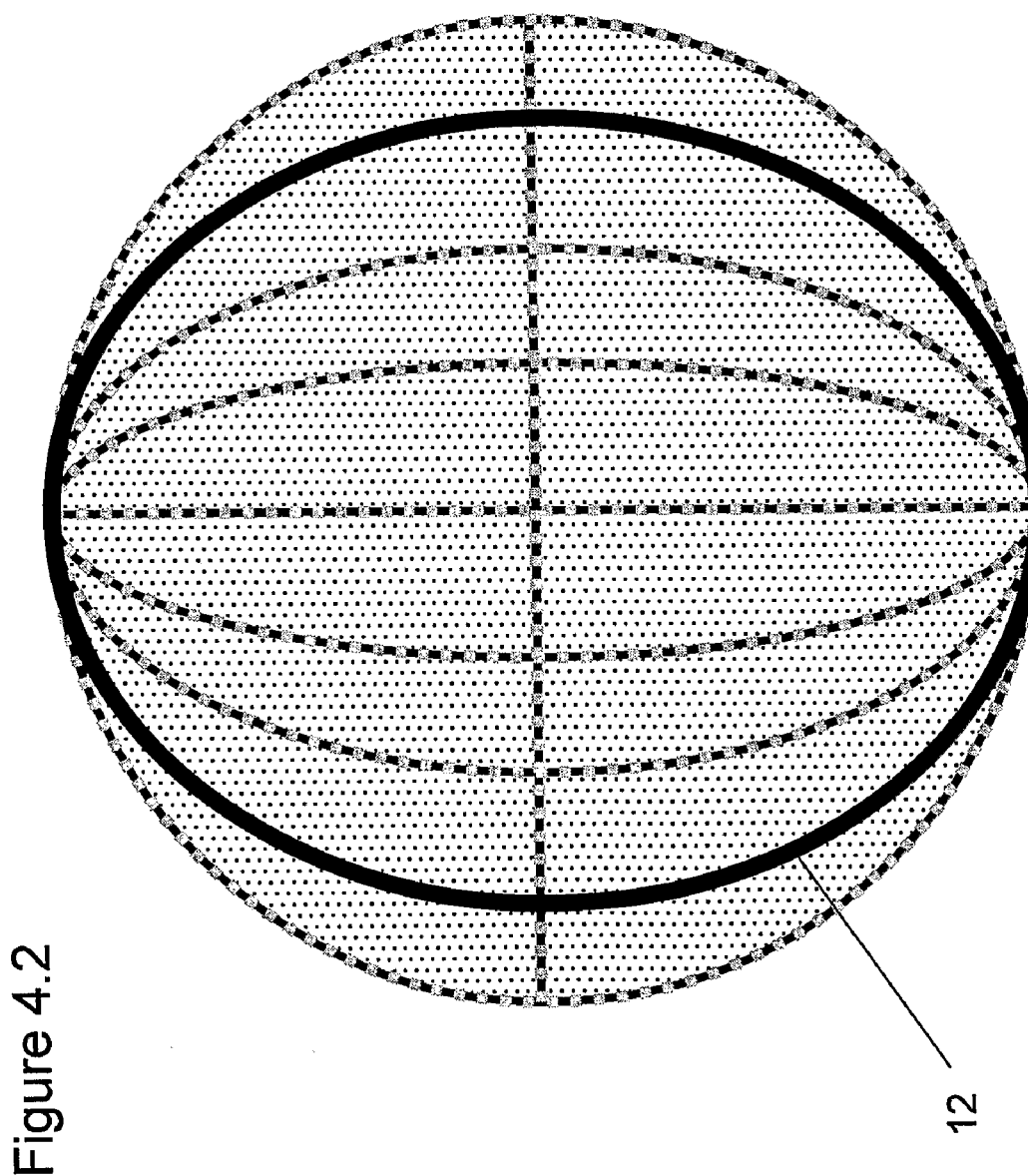
Figure 4.2

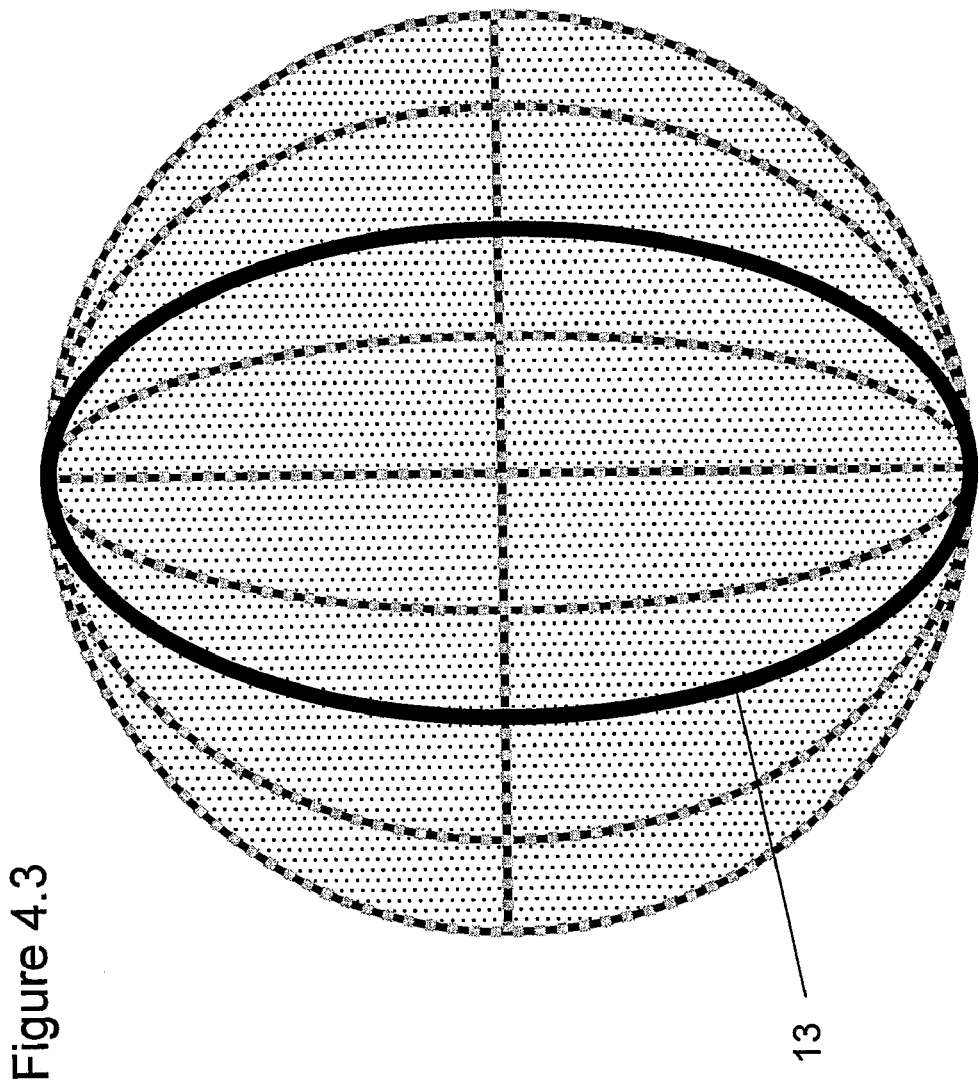
Figure 4.3
13

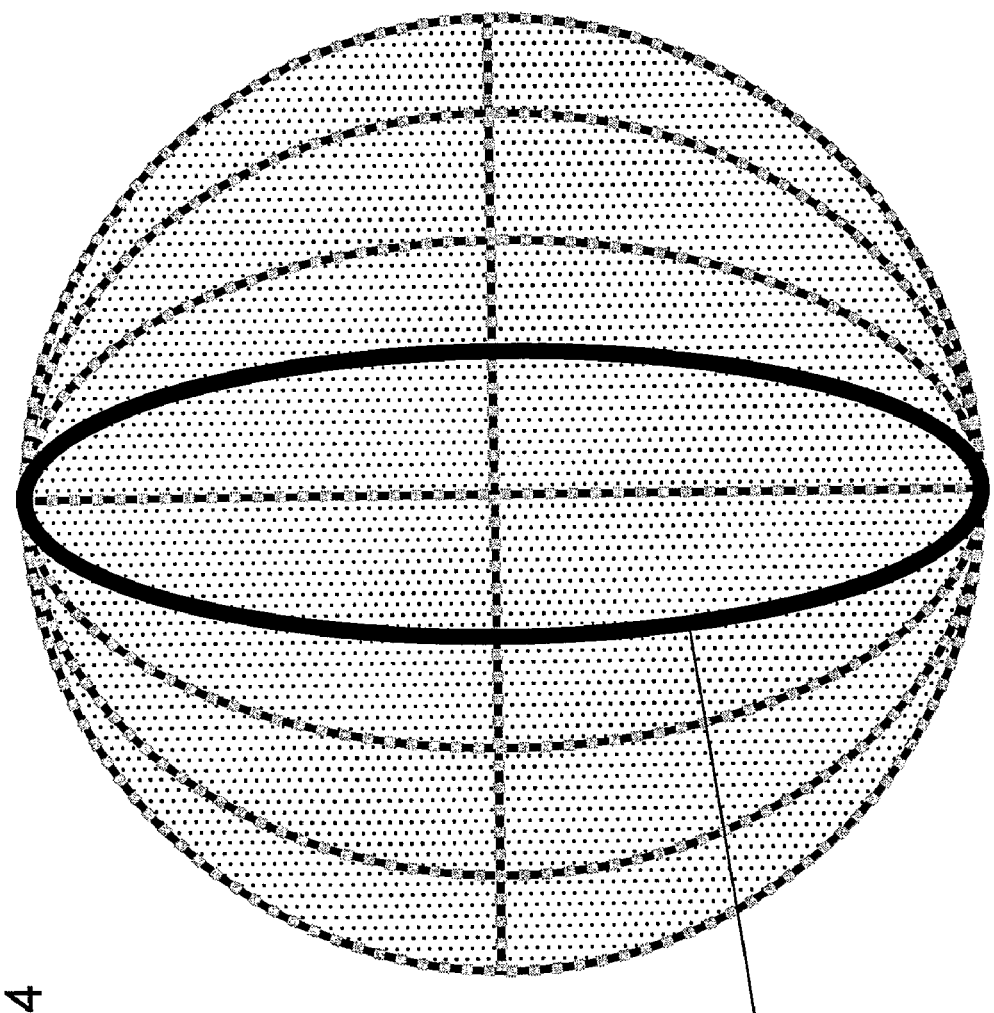
Figure 4.4

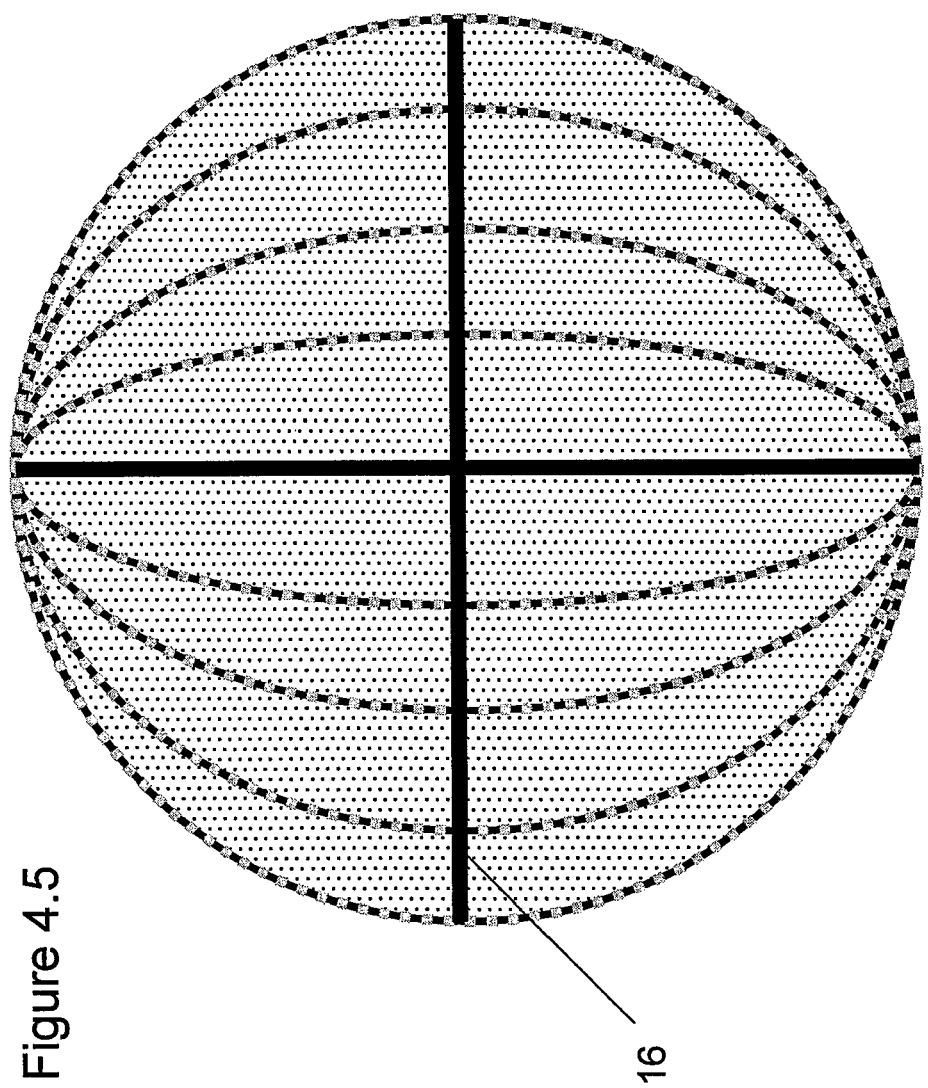
Figure 4.5

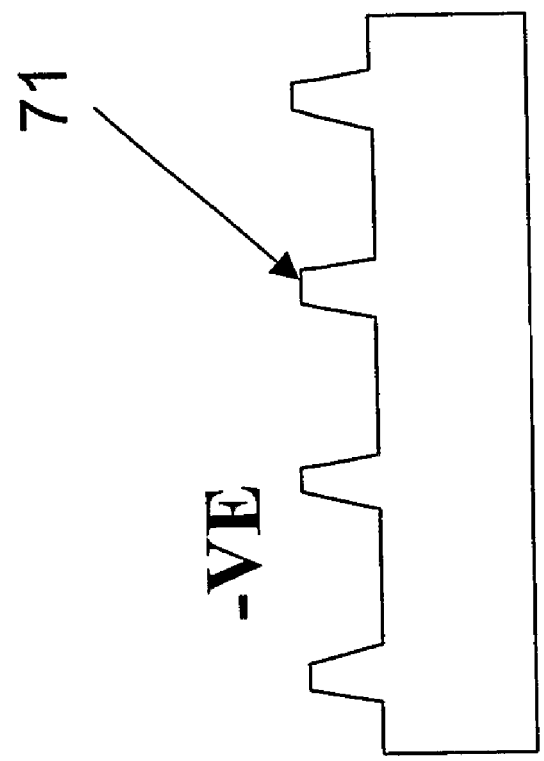
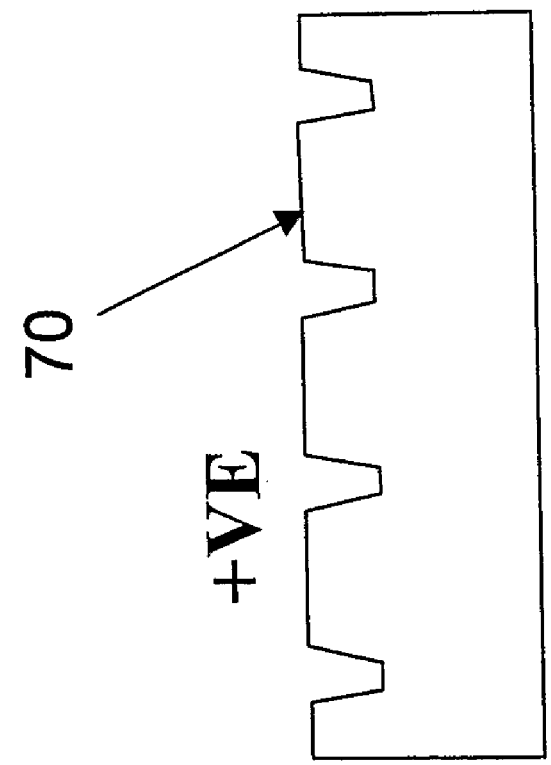
Figure 10

OPTICALLY VARIABLE SECURITY DEVICE

Currently within the optical security industry there exists the dual requirements of creating optically variable designs and effects, which have a level of visual simplicity and uniqueness commensurate with the need for clear and unambiguous public recognition and verification, whilst being immune from simulation by the techniques and technologies accessible to organised crime. The particular focus of this invention is the class of optically variable devices wherein the optical effects are generated by the fundamental mechanism of diffraction (first or zero order) that occurs at an interface or surface on the device that is comprised of embossed surface relief. Devices operating through the first order of diffraction are known within the industry as DOVID's (Diffractive Optical Variable Image Device). The most sophisticated threat to the integrity of a high security DOVID is re-origination or reproduction by the relatively uncontrolled origination technologies used to generate iridescent effects and optical imagery within the decorative foiling industry (e.g. commercial spec dot-matrix systems and interferential masking techniques).

As a result, origination providers have made limited efforts to combine within a primary embossing master shim, tool or die, respective image components which have been generated/recorded by two or more complementary origination methods or technologies. Said origination methods being complementary in respect of the optically variable effect (s) they present to the observer.

Now it is widely recognised within the optical industry, that diffuse white light holography (as exemplified by the Benton Rainbow Hologram) and electron beam lithography represent the two most complementary DOVID recording methods or technologies. The Benton Rainbow Hologram being best suited to providing overt or macro image effects, which are easily recognised and interpreted by the layperson—such effects being 3D and stereographic effects (i.e. changes in perspective and parallax generated by models and multiplex photography) and simple full symbol image switches. Whereas electron beam lithography is best suited to generating complex transformational line effects and high-resolution micro graphical effects (i.e. alphanumeric characters and symbols with dimensions less than 50 micrometers).

Furthermore the use of optical-interferometric techniques such as Benton holography is generally limited to recording sinusoidal surface relief microstructures that are symmetric in the plane of dispersion. The use of electron beam lithography, wherein the detailed profile of each individual diffraction grating is exposure-etched out of the recording medium, lends itself to the generation of non-symmetric relief profiles which produce positive and negative diffractive orders of unequal brightness-sometimes referred to as blazed structures.

Hitherto conventional practice within the, industry has been to independently record/expose the holographic and electron beam image components onto two separate recording plates—each plate typically having a fundamentally different class of resist material optimised for the needs of optical and electron beam lithography. From each respective master plate an embossing die is made for the optical and e-beam image components. To obtain the complete image, each die can be either sequentially stamped into a thermoplastic material in positional register or both dies can be co-located (i.e. placed one against another) to stamp or impress into the thermoplastic a negative copy of the complete image. This process of producing a complete image from its component elements is referred to within the industry as mechanical recombination, and the substrate containing the resulting complete is referred to as the recombine.

We have considered for conceptual simplicity a method of recombination achieved through the process of the thermal embossing, however it could equally well be delivered in a very similar way using UV cure replicating process. Now one recognised limitation of mechanical recombination is the presence of seam lines which define the perimeter of each image die—seam lines will in one form be defined as a ridge of relief arising from the displacement of material that occurs when the image dies are pressed into the thermoplastic layer or UV curable monomer. Such ridges are often at an elevation which exceeds that of the diffractive micro-structure and as a consequence can cause significant problems in subsequent manufacture wherein the DOVID is replicated in volume by a process of semi or non compliant embossing. The seam line will also typically be manifested by an absence or discontinuity in the replication of microstructure in the boundary between the two dies—in simple terms a dark line defining the boundary between the 2 image areas or components.

From a design perspective, a further limitation associated with the method of mechanically recombining optical-interferometric and electron beam recorded image elements is that it is inherently unsuitable for producing image types wherein the electron beam element (or vice versa) is provided as an intricate pattern of lines or shapes which overlap or interlock in a precisely registered manner with a corresponding image component. This can be understood by recognising that when an embossing die containing the second image pattern is pressed into a thermoplastic layer which has already received an impression from the first embossing die, the effect of the second embossing die is to not only emboss the new image pattern, but also to strongly diminish or destroy any of the first image component that overlaps with its die area.

Within WO2004/077493 methods are described which seek to move technology beyond the limitations associated with mechanical recombination. The principal teaching of this document is to provide a recording plate (more specifically a photo-resist plate) provided with two separate resist layers wherein each resist layer is adapted or responsive to a different radiation type. Of particular relevance to our teaching is the case where one radiation type may be blue laser light (442 nm, or 457 nm typically) and the other radiation type is provided by a flux or focused beam of electrons. That is the first resist layer can be recorded with an optical inteferometric image and the second resist layer can be recorded with an electron beam image. However the use of two resist layers will in practice add a significant and a times restrictive level of complexity to the origination process. Particularly for the case when generating an image comprised of either intricately overlapped or interlocking optical-interferometric and electron beam image components, or when superposing the two image components.

It should be noted that the exposure of two different optical-interferometric techniques on to one recording plate is an established practice within the art for the particular case where the wavelength of the respective laser sources are close together in the blue part of the spectrum (e.g. the HeCd 442 nm line and the Ar ion 457 nm line) developer. Commercially available photo-resists are available (Shipley S1800) which have been formulated to have a similar photochemical sensitivity over this range thus making it a relatively simple task to apportion the correct exposure energy to each of the optical image components.

Generally the resists preferred by someone skilled in the art of electron beam lithography are chemically different to those adapted or preferred for optical-interferometry, holography and the like. For example one of the commonest resists used in electron beam lithography, namely PMMA, exhibits little or no photochemical response when exposed to actinic or soft UV radiation. Conversely a photo-resist (that is to a resist which is photo-chemically active) optimised for exposure in the soft UV and deep blue may have very poor sensitivity or contrast ratio for electron beam recording. For a more detailed review of optical and electronic resist see "Handbook of Microlithography, Micromachining and Microfabrication, Volume 1: Microlithography", page 209, edited by Rai-Choudhary.

Now a further potentially critical problem arises when imaging a focused beam of electrons onto what is usually an organic insulating layer of resist located on an insulating substrate, in that substantial localised charge build up can occur. Without a mechanism for discharging the rapid localised accumulation of electrons that will occur in the exposed image area, there will be a rapid build up in the electrostatic potential within the exposed areas and therefore strong electrostatic fields which will act to repel the incident electron beam causing considerable distortion within the e-beam written relief structure. Within conventional e-beam lithography one commonly practised approach to this problem is to overcoat the resist with a very thin layer (ca 10 nm) of a metal such as gold, gold-palladium alloy, chrome or aluminium. The high-energy electron beam can easily pass through such a thin layer of metal and thus expose the underlying resist. Before developing the resist, it is then necessary to etch away the metal film using an appropriate etchant.

More recently an alternative approach being practised, is to provide a conducting polymer underneath the resist which has a surface resistance around 20M$\Omega$/square. For the case where said polymer contains a solvent which interacts with the resist then a further barrier layer needs to be provided between resist and the conducting layer (this barrier layer being preferably water soluble).

In accordance with the present invention, a method of forming a security device comprises:

a) providing an undeveloped photoresist layer on an electrically conductive layer;

b) forming a first diffractive pattern in the undeveloped photoresist layer using optical-interferometry;

c) forming a second diffractive pattern in the undeveloped photoresist layer using electron beam lithography; and d) thereafter developing the photoresist layer.

With this invention, we are able to provide diffractive patterns produced by optical interferometry and electron beam lithography respectively in the same photoresist layer.

With respect to the formulation of the resist layer this should (for the development chemistry used):

exhibit a positive response to both the optical and electronic exposures or a negative response to both the optical and electronic exposures We therefore need to exclude photo-resists wherein electron exposure can simultaneously generate both a positive response and negative response (cross-linking) Next an intermediate layer or layers is located between the photo-resist layer and the substrate layer. The intermediate layer(s) act primarily as the conductive layer but may also act as an absorbing anti-reflection coating to suppress internal reflections within the resist plate. The conductive layer dissipates electronic charge that accumulates on the resist surface during the electron beam recording process. The conductive layer preferably extends to the edges of the resist on at least two predetermined sides. In one preferred embodiment a partially transparent layer of a metal such as Chrome (deposited typically by the process of vacuum deposition) is used as the conductive layer—such a layer fulfilling both the functional requirements of an anti-reflection layer and that of a conducting layer transferring electrical charge deposited on the resist through to ground. Alternatively, the chrome layer may be provided with an anti-reflective coating such as chromium oxide or silicon dioxide between the chrome layer and the photoresist.

In another embodiment two intermediate layers may be provided wherein the first intermediate layer in contact with the resist may be comprised of a non-metallic coating with surface resistance less than 10 M$\Omega$/sq. Such coatings can be created by dispersing Antimony tin oxide or Carbon Black in an organic binder.

Or a commercially available coating such as ESPACER 100 (supplied by Showa Denko). Such coatings being applied to the substrate by conventional spin coating. The second intermediate layer being a coating which absorbs 'blue' light as ferrous oxide or Ebonite black (supplied by Canning).

The security device could be used as formed but typically will be used to form a die or shim to enable copies of the security device to be formed using conventional embossing techniques.

In particular, the security device may be used in conjunction with a security document or article comprising a banknote, cheque or travellers cheque, certificate of authenticity, stamp, bond, tax disc, fiscal stamp, secure label, passport or voucher, identity card and the like.

Some examples of methods according to the invention will now be described with reference to the accompanying drawings, in which:—

Figure 5:
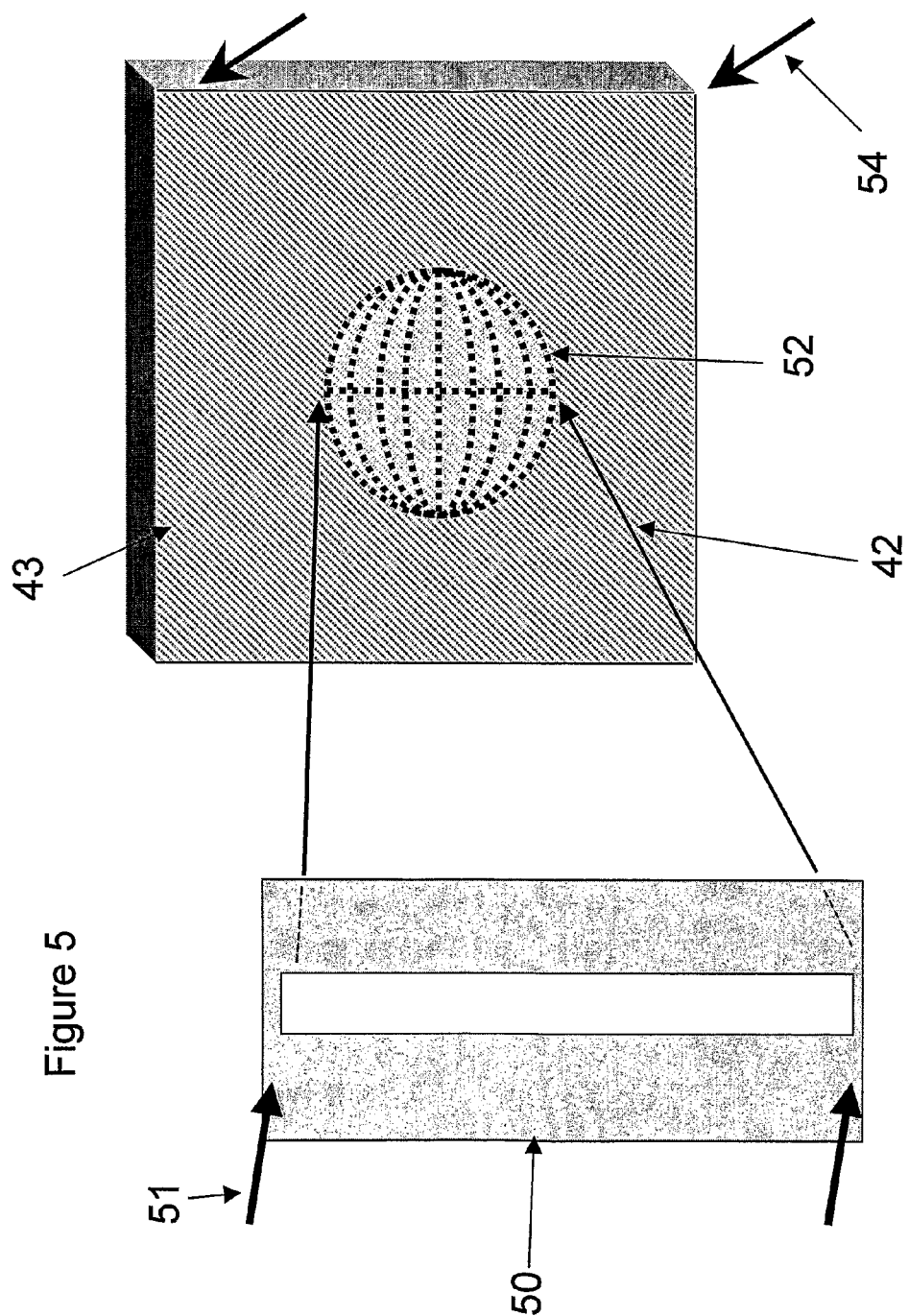
Figure 6:
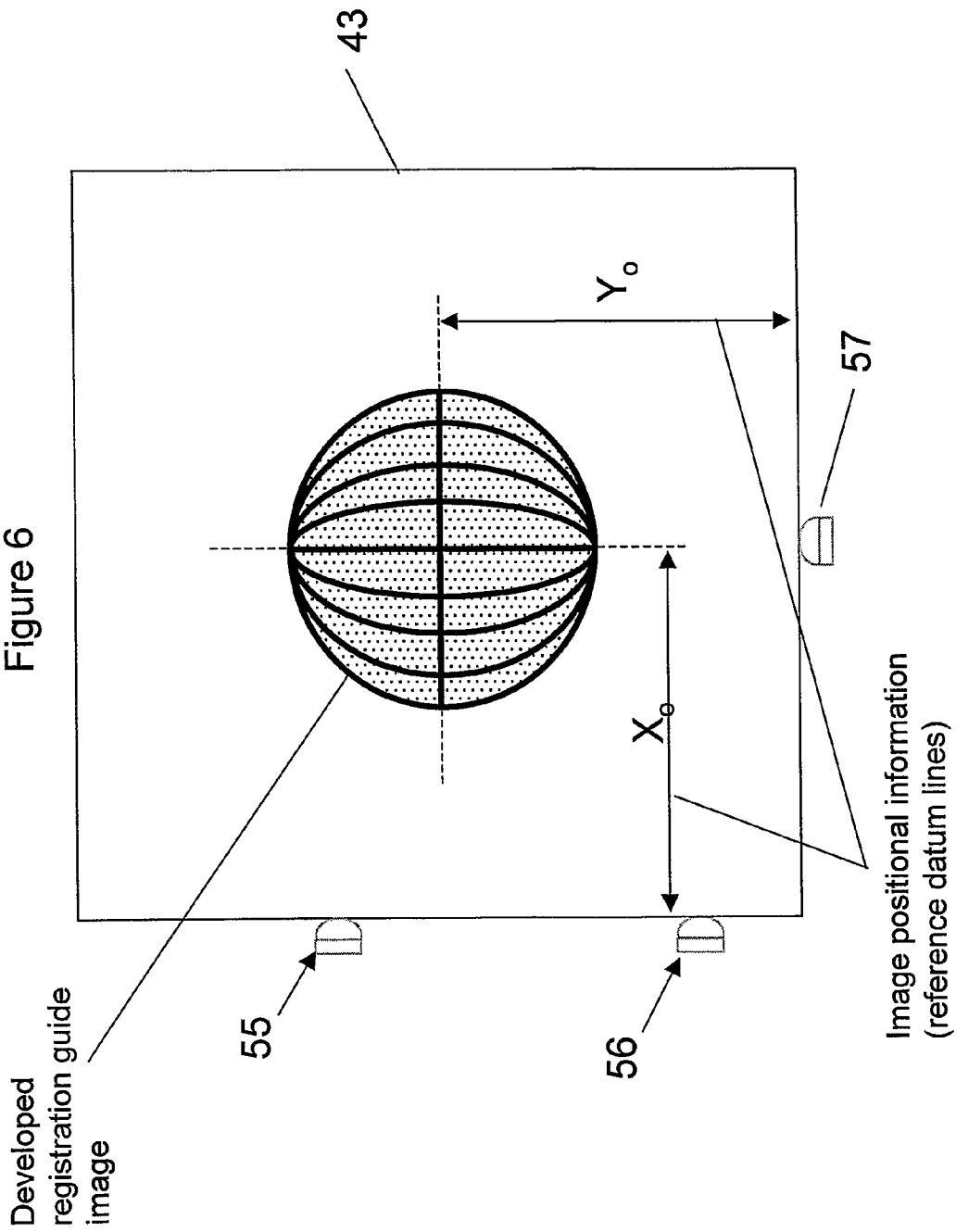
Figure 7:
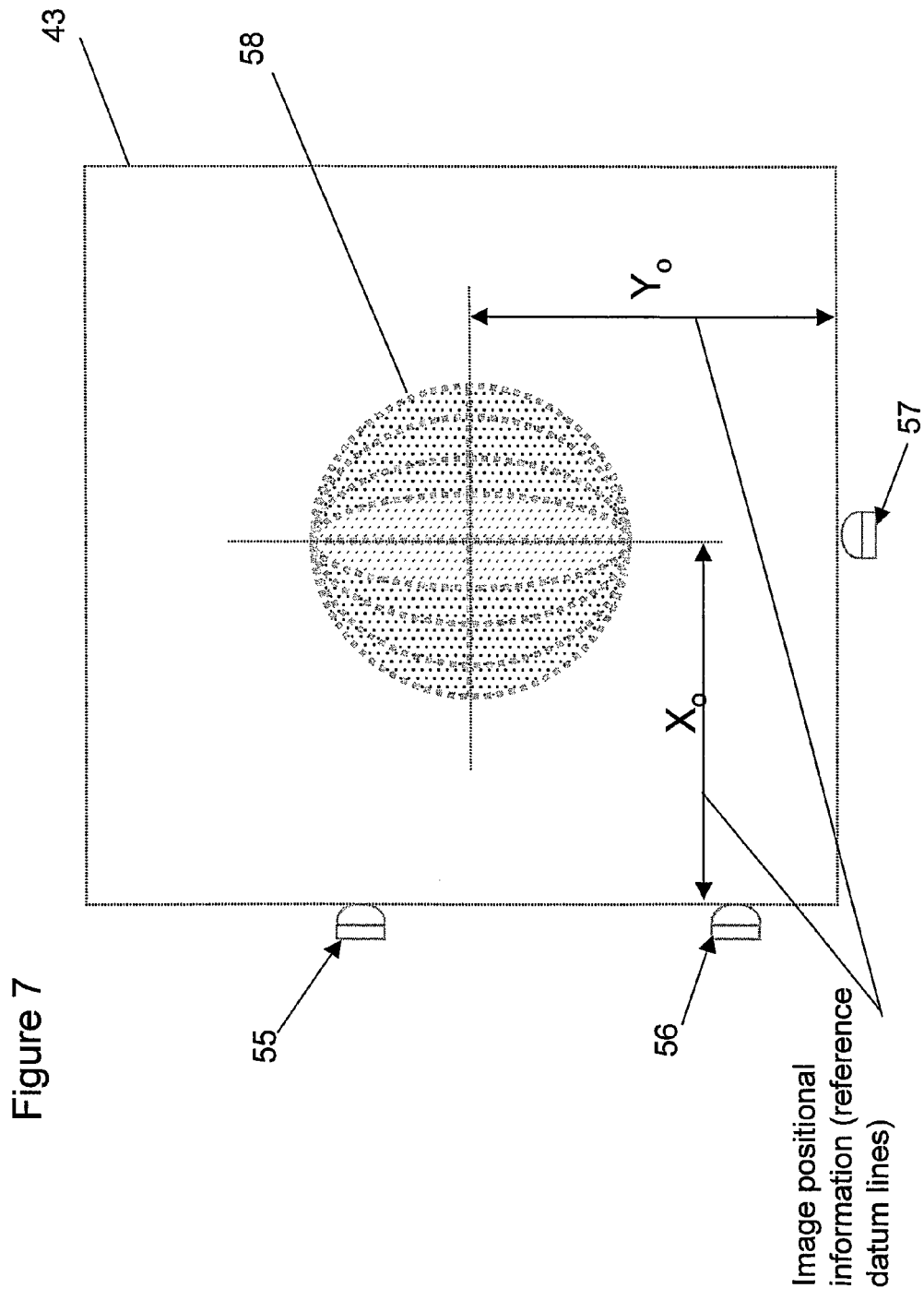
Figure 8:
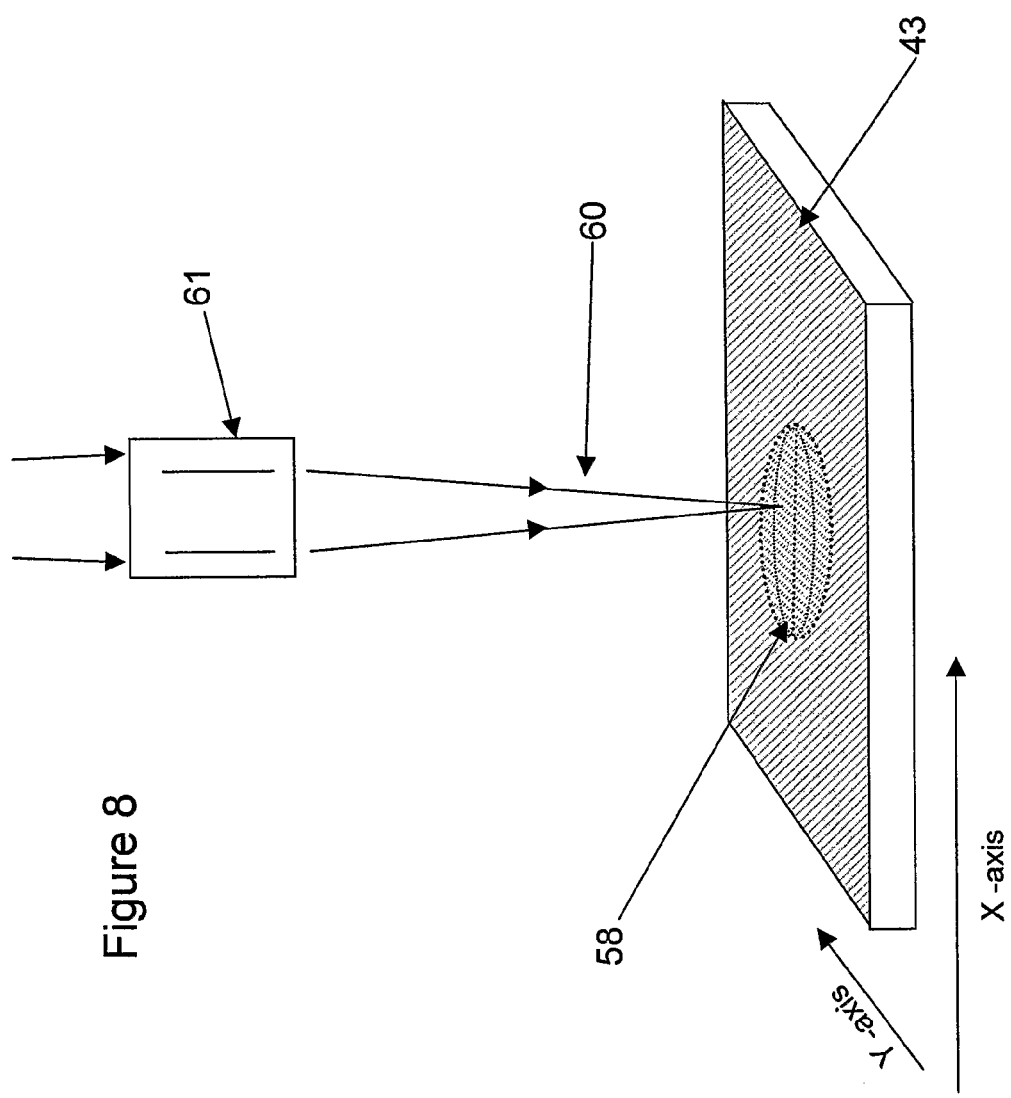
Figure 9:
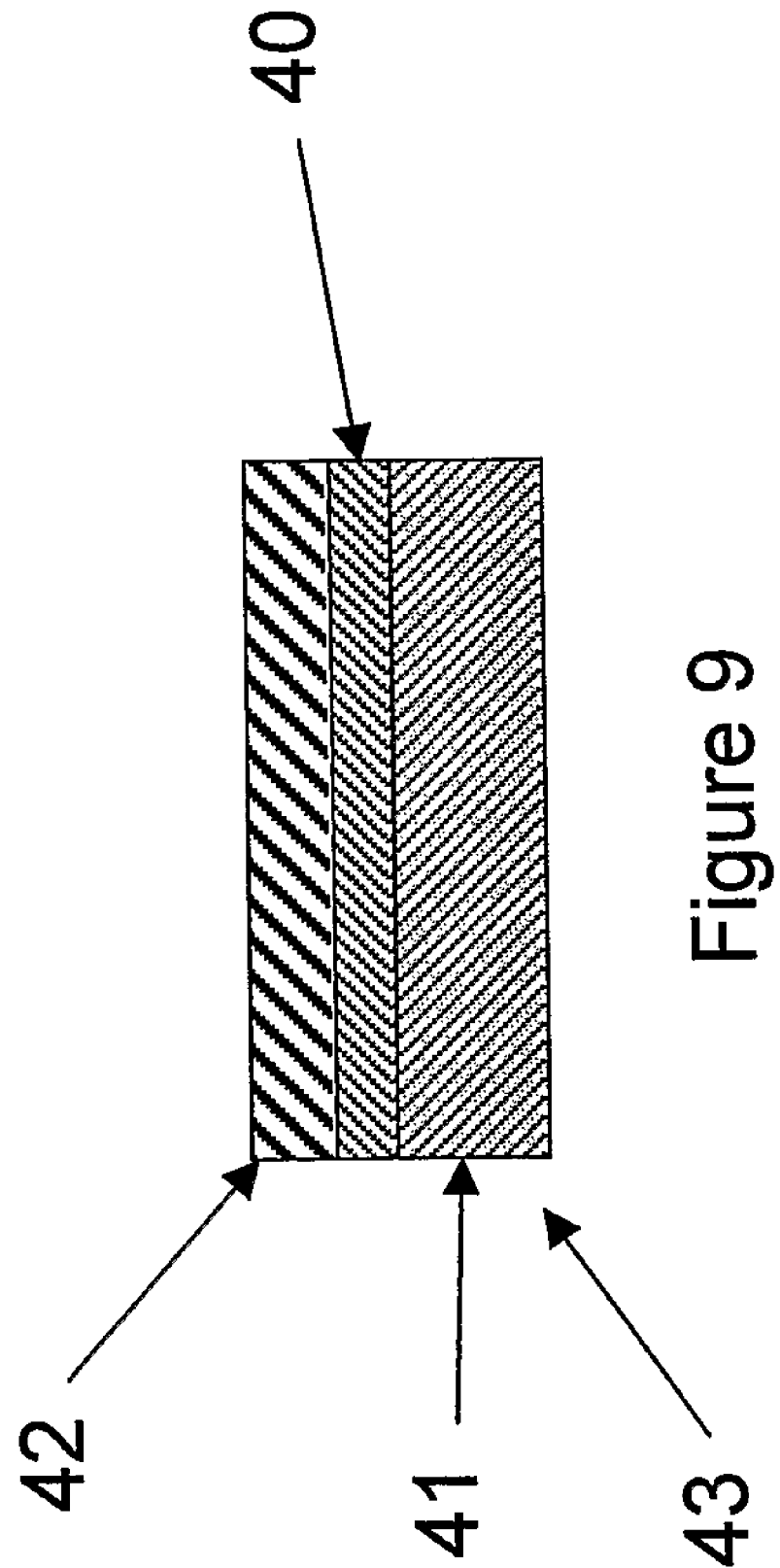
Figure 11:
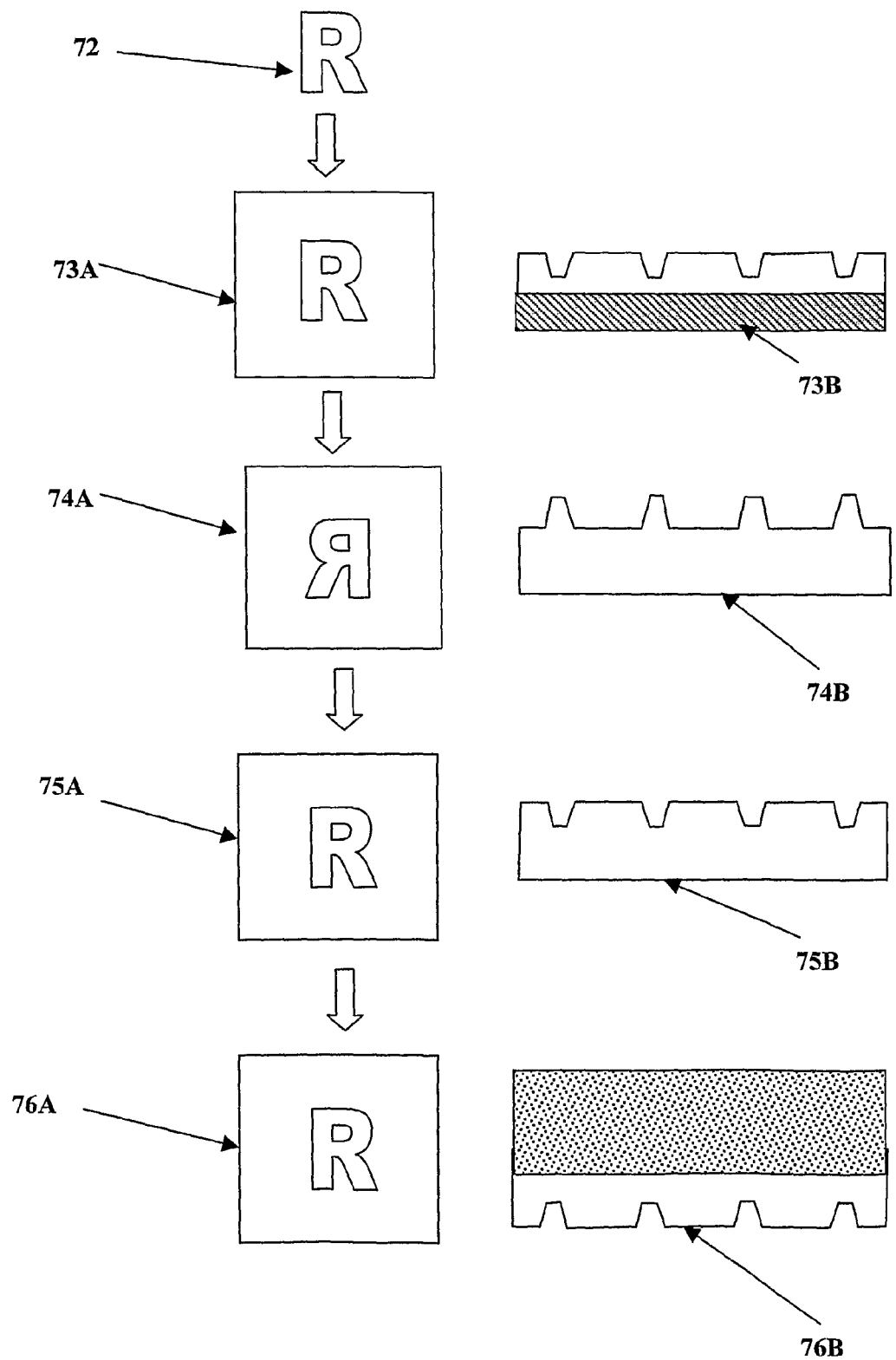
Figure 12:
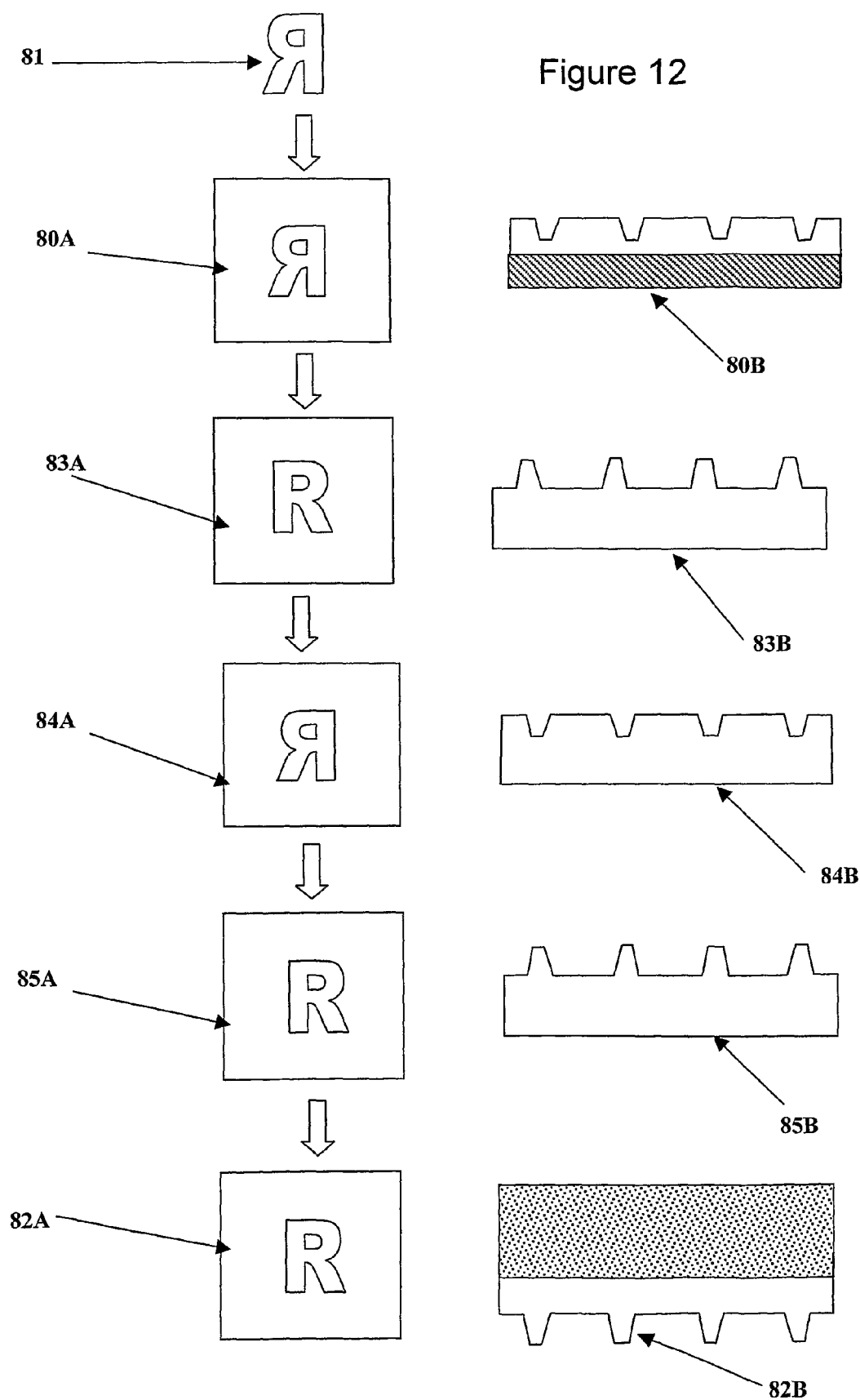

FIGS. 4.1-4.5 illustrate the manner in which meridian lines of the composite image switch on and off in a predetermined sequence;

FIG. 5 is a schematic diagram illustrating the H1-H2 recording process;

FIG. 6 illustrates the way in which an optical image is located on a photoresist plate;

FIG. 7 illustrates a photoresist plate exposed to an optical image component prior to development;

FIG. 8 illustrates a photoresist plate with an undeveloped electron beam image;

FIG. 9 is a schematic cross-section through an example of a photoresist master plate;

FIG. 10 illustrates a conjugate embossed pattern;

FIG. 11 illustrates, in plan and cross-section, successive steps in a conventional method for forming embossing shims; and, FIG. 12 is similar to FIG. 11 but illustrating an example of a new method for producing an embossing shim according to the invention.

A method of combining optical-interferometric and electron beam image components into one unified image by the process of successive spatially registered exposures into a single resist layer that is processed in a common developer will now be described. The method also allows the two image components to be optimised such that that they are of a similar brightness.

The method will be described by means of a preferred embodiment wherein the optical-interferometric image components (OIC) and electron beam components (EIC) appear at the macro visual level to spatially overlap or interlock in a precisely registered manner. In simpler terms they appear to be sub elements of the same discrete artwork element. Though it should be under stood that the inventive teaching is equally suitable for an embodiment wherein the OIC and EIC are located in neighbouring but visually non-overlapping areas of the resist plate—e.g. they appear as separate discrete artwork elements within the overall optically variable image. In such an embodiment the registration requirements are generally less precise.

Figure 1:
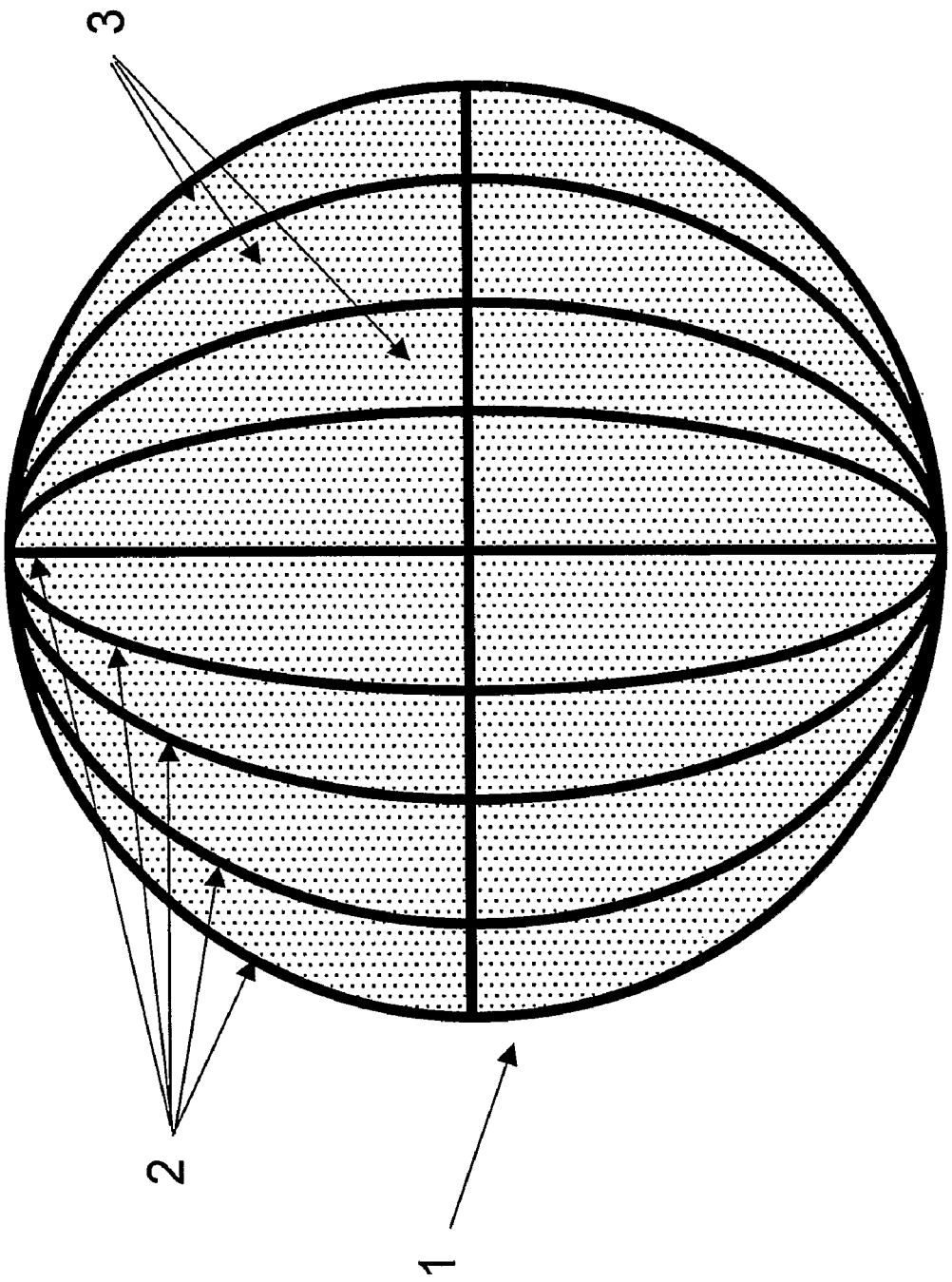
FIG. 1 illustrates graphically an example of an optical image component.

To illustrate the primary inventive method we consider the particular example of creating a combination DOVID that is comprised of an iconic representation of a globe 1 containing vertical and horizontal curvi-linear meridian lines 2 (FIG. 1). The predominant background area 3 of the globe 1 is created by exposure to two overlapping beams of coherent light, through the holographic (optical-interferometric) process. Within the optically recorded globe background 3, the meridian lines 2 are present as regions where there is no holographic microstructure, i.e. regions of microstructure or image void. The sizes of these meridian void areas 2 are slightly increased to allow for a small registration tolerance. FIG. 1 shows the globe that is the optical image component, wherein the black meridian lines are the void regions that will be later exposed to the grating structure generated by the electron beam imaging system.

Figure 2:
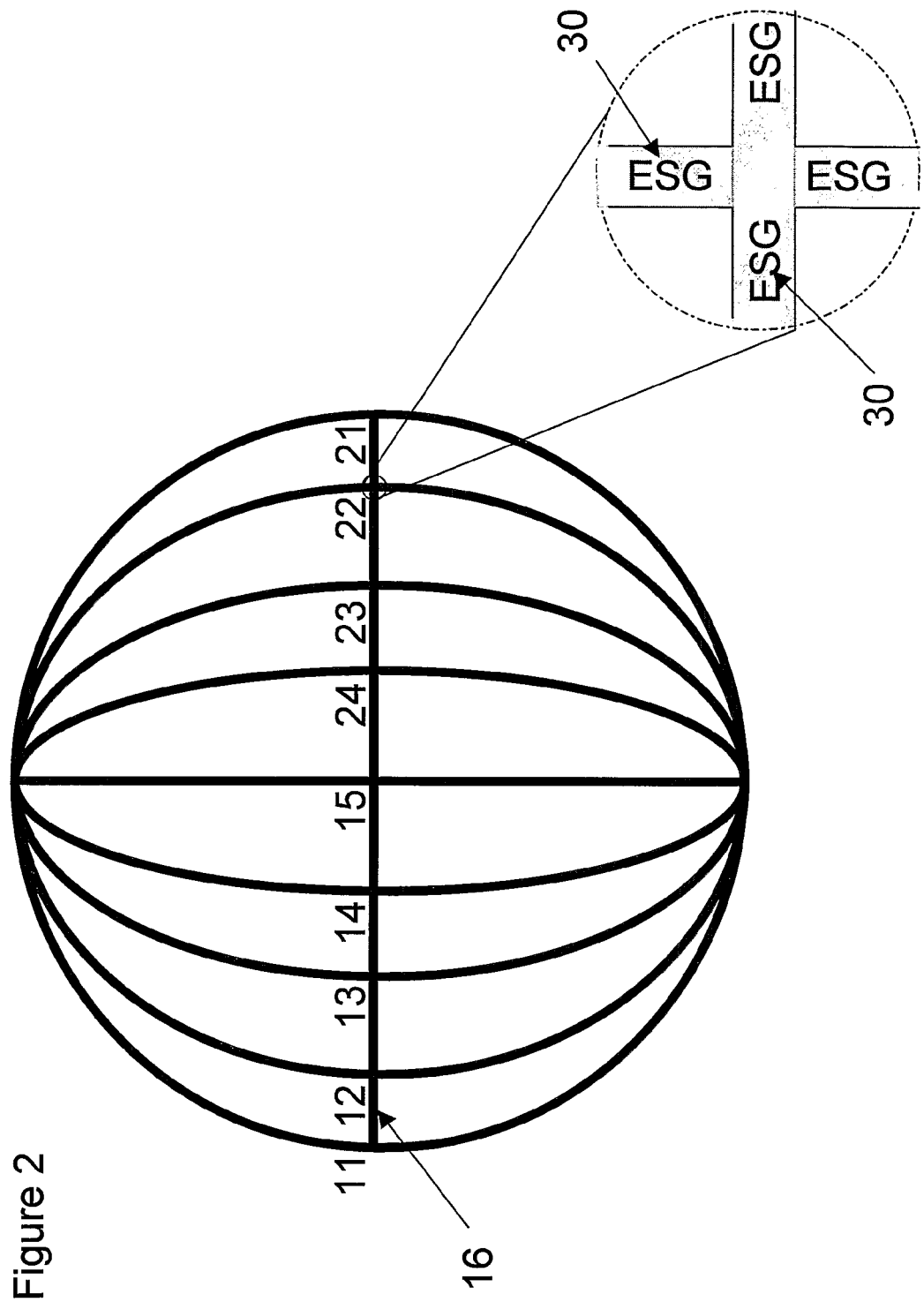
FIG. 2 illustrates an electron beam lithographic image component corresponding to the optical image component of FIG. 1.

FIG. 2 shows the image artwork, comprised of meridian lines 11-16,21-24 that are to be exposed or recorded by e-beam.

For a typical high security image the globe 1 may have a diameter in the range 5-15 mm. It is therefore advantageous to design the meridian lines to fall outside the resolution range of commercial dot-matrix imaging systems (600-1000 dpi). We therefore choose the meridian lines 11-16,21-24 to have a line-width of 20-100 micrometers, which would be beyond the capability of such systems to reproduce in an effective way. We could advantageously further exploit the resolution capability of e-beam (circa 0.2 micron spot size) to provide within the meridian lines micro-graphical characters or indicia 30 with character heights in the range 5-50 microns (as shown in FIG. 2). The provision of diffractive meridian lines of such a line width (and optionally extra small graphical content) which precisely interlock with the optically recorded globe is beyond the precision of mechanical recombination to deliver.

Figure 3:
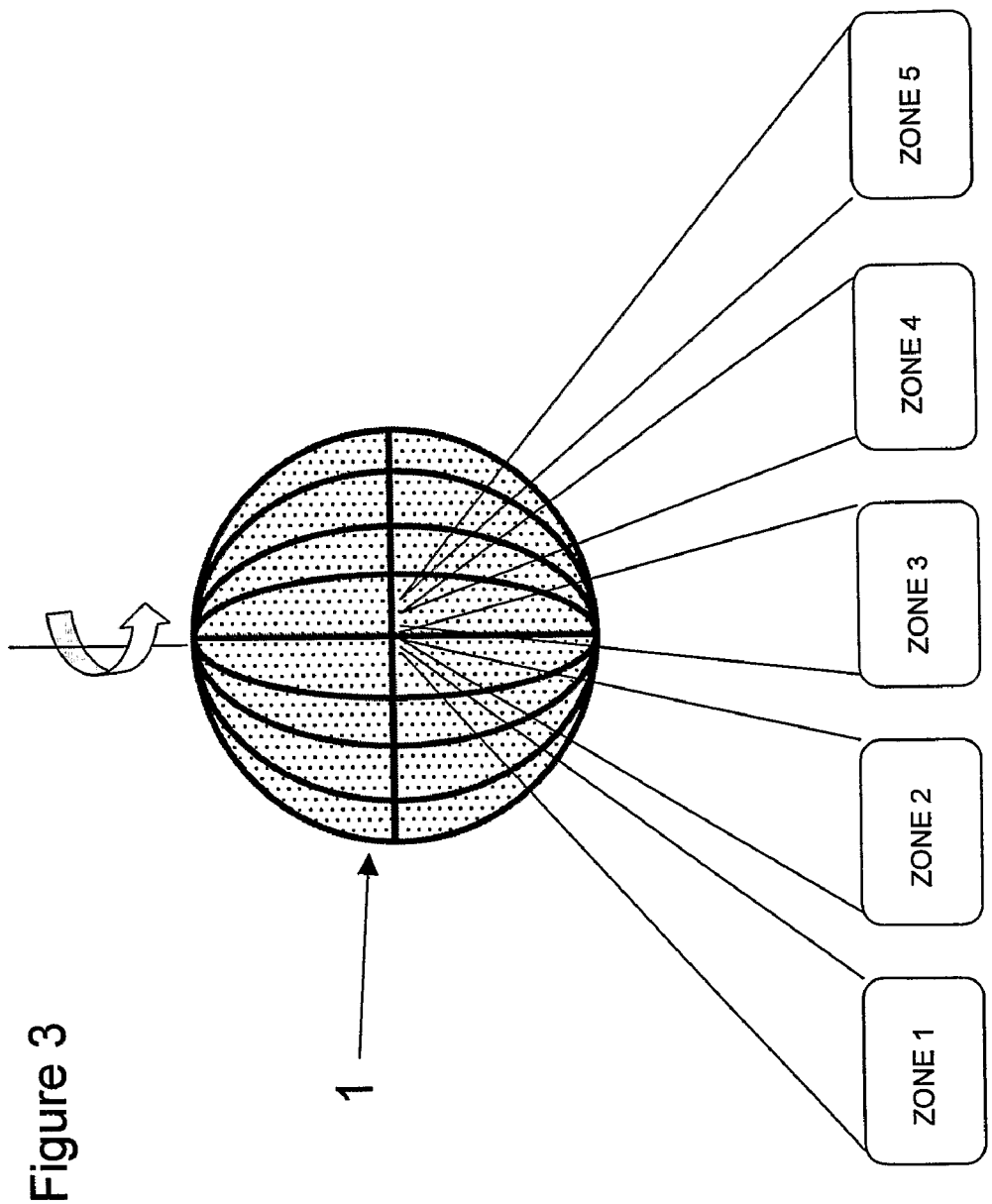
FIG. 3 illustrates the angular replay characteristics of the composite image.

Finally we also show in FIG. 2, that in order to facilitate public recognition and increase the technical complexity of reproduction by mechanical recombination or solely by optical-interferometric techniques, each meridian line 11-16,21-24 may be recorded with a different grating orientation to create a progressive animation effect. The animation sequence maps out which line will be seen from each viewing zone as the OVD is tilted about the axis of rotation, see FIG. 3.

Each meridian line 11-16,21-24 switches on and off in a pre-determined sequence; this is shown in FIGS. 4.1-4.5. This type of animation sequence would be extremely difficult to achieve using existing mechanical stamping techniques that join two origination technologies together. It would require the meridian lines to be stamped over the globe without obliterating what was already there.

The basic process for fabricating a suitable photo-resist plate 43 (the H2 resist master) comprises first vacuum depositing a thin film (10-20 nm) of Chromium 40 (FIG. 9) on a quartz or soda lime glass substrate 41, taking care to ensure that the chromium layer 40 extends fully to the edges of the glass substrate 41. The Chromium layer provides the functions of a conductive layer and an absorbing anti-reflection coating. Onto this is then coated a suitable photoresist layer 42 with a thickness which may vary in the range of 200 nm to 20000 nm, depending on the depth and type of surface relief required. Though for the case of a conventional DOVID operating in the first order of diffraction the preferred thickness will fall within the range of 500 nm to 2000 nm.

Experimental work has shown that a suitable positive photo-resist is the Microposit S1800 series supplied by Shipley which contains the following solvent: propylene glycol monomethyl ether acetate. The resin used in this photoresist is novolac based and the photoactive compound belongs to the group of diazonaphtoquinone (DNQ) sulfonates. An appropriate developer which delivers a good contrast factor γ for both the optical and electronically generated surface relief is Shipley's Microposit 303 at a dilution in water of 1 part to 6.

A preferred method for recording or generating the optical image component (OIC), namely a Benton transmission Rainbow Hologram, within the photo-resist plate 43 (the H2 master) of FIG. 9 will now be described.

The first stage of this process is to record, within an intermediate transmission hologram (the H1) 50 (FIG. 5), the artwork components that comprise the OIC. The artwork components can be, for example, a sculpted model or a layered planar arrangement of transmissive artwork masks (e.g. 'glass transparencies'). The fundamentals of this process are well known in the art as the Benton H1-H2 holographic recording process. Following the recording and development of the intermediate transmission hologram 50 (the H1), the next stage is to re-illuminate said H1 50 with a conjugate 51 of the reference beam used to record it. Illumination of the H1 50 by its conjugate reference 51 causes it to transfer or project a real holographic image 52 (the H2 object beam) of the previously recorded artwork elements. The focal plane of the H2 object beam is then allowed to fall on the photo-resist plate 43 and overlaps the reference beam 54 (the H2 reference beam) to record a holographic interference pattern, which is spatially defined by the H2 object beam. A schematic illustration of the H2 recording process is shown in FIG. 5. The OIC is at this stage a non-visible latent image. In order to visualise the image component it is necessary to develop the plate 43. In the case of a positive resist (such as Shipley S1800) the solubility of the resist in developer increases with exposure energy (the relationship being linear in the preferred operating zone) hence the bright interference fringes (interference maxima) generate the troughs in the periodic relief patterns whilst the dark fringes (minima) correspond to the 'peaks' in the periodic relief.

During the recording of the combined security device it is advantageous that the location of the H2 object 52 is precisely referenced to datum surfaces or points on the photo-resist master 43 which will remain invariant of dimensional changes in the photo-resist plate (such as variations in size, thickness or orthogonality of the sides). Specifically it is preferred that the plate holder have three locating pins 55-57, two of which 55,56 are located in the horizontal plane and one 57 in the vertical plane, with each pin making a point or radiused contact with the respective sides of the H2 resist master 43. In such a system the projected H2 object is spatially referenced to these three contact or datum points.

Using the process described above, a set-up plate is generated by exposing a first resist plate to one or more OIC's located in predetermined positions with one or more predetermined energies. This plate is then developed in an appropriate resist developer to convert the latent OIC's into visible relief images. The coordinates (see FIG. 6) of each OIC, or more particularly associated registration datum marks, lines or cross-wires recorded adjacent to each OIC are then determined by measuring their distances from the respective datum points or edges by means of a travelling microscope or some other technique such as optical scanning of the plate. Through this process we determine the precise position of the image with reference to the registration datum lines (Xo, Yo), see FIG. 6, which are provided on the H2 master 43.

Following the generation of the set-up plate the next step in the process is to record one or more H2 resist plate masters with said OIC components, wherein these additional photo-resist plates will subsequently be recorded with the second electron-beam image component (EIC). Each additional H2 photo-resist master is recorded with at least one OIC recording and preferably at least two to three OIC recordings in the same predetermined positions and with the same predetermined positions as the H2 set-up plate. Because of the arrangement of three pin datum pins 55-57 provided in the resist plate holder, the position or X, Y coordinates of the virtual OIC in each additional H2 resist master (see FIG. 7) will match the $X_0, Y_o$ coordinates of the OIC in the set-up to within 50 microns or better. It should be noted that in contrast to the set-up plate there is no processing or development of these H2 photo-resist masters in between the recording of the OIC and EIC.

It should be appreciated that although we have described a method for originating the OIC based on the Benton H1-H2 recording process, the inventive concept is not limited to that origination technique. The inventive method could be readily adapted such that the OIC has been generated by the process of optical interference lithography, wherein transmission masks are placed in intimate contact with the resist and the combination irradiated by the light interference pattern generated by two overlapping laser beams. This approach could be used to generate either first order diffractive relief or zero-order diffractive relief.

Alternatively, the OIC could also be generated by a conventional dot-matrix system, wherein it is anticipated that the dot-matrix image will contain low resolution artwork elements (for example $\leqq 2500$ dpi) whilst the e-beam component will contain the high resolution artwork elements ($\geqq 2500$ dpi and especially $\geqq 5000$ dpi).

Upon completion of the recording phase for the OIC, the resist masters will then be located in a second plate holder pertaining to the electron beam machine, wherein the second plate holder is required to be geometrically equivalent to the first (OIC) plate holder as regards the arrangement and position of the locating or datum pins. It should be noted that the datum pins 55-57 are conductive, preferably metal, and they should have a conductive path to an electrical earth. For example the conductive datum pins 55-57 will typically be fixed in a plate holder made from stainless steel which is electrically earthed. Consequently when the H2 resist master 43 is inserted into the plate holder and located firmly against the conductive datum pins 55-57—the conductive metal layer 40 located between the resist layer 42 and the glass substrate 41 will make sufficient electrical contact with the conductive datum pins 55-57 to ensure that the electronic charge that is deposited in and accumulates on the resist layer during the electron beam exposure process will be conducted away to earth. Thus critically preventing the build up of electrostatic charge that can distort and degrade the recording of the EIC.

Considering next the recording of the EIC, the first step of this process is to utilise the X-Y optical image coordinates determined from the set-up plate in order to select the appropriate electron beam exposure or 'write' coordinates for the EIC. Previous exposure trials will have established proximity electron-beam exposure energy for the EIC to ensure that it surface relief amplitude evolves at the same rate as the OIC surface relief when the H2 master 43 containing the combined image (OIC and EIC) is chemically processed. As an example for a resist such as Shipley S1800, it has been found that a preferred exposure energy for recording the OIC will lie between 10 mJ/cm$^2$ and 20 mJ/cm$^2$ with a corresponding electron beam exposure energy in the range 10-30 $\mu$C/cm$^2$ and especially in the range 15-25 $\mu$C/cm$^2$.

When the optimal exposure coordinates and energy have been selected a first H2 master 43 (containing the latent OIC 58) then undergoes the electron beam recording or writing process by exposure to a focussed beam of electrons 60 from a source (not shown) via a focussing system 61 thus generating the latent EIC as shown schematically in FIG. 8. The H2 master 43 is fixed against said datum pins in the previously described electron beam plate holder.

It is current industry practice to use e-beam lithography to originate an EIC comprised not only of first diffractive structures (grating periodicity $\leqq 5$ $\mu$m) but also of zero order structures (rectangular profile and grating periodicity $\leqq 5$ $\mu$m). E-beam lithography could also be used to originate an EIC comprised of very coarse structures (periodicity $\geqq 10$ $\mu$m) which behave according to the geometric laws of reflection and refraction.

Following exposure of the EIC, the resulting H2 resist master 43 is then chemically processed or developed to generate a visual image of the desired brightness, thus generating the completed H2 resist master. Now if on inspection of this first H2 master, it is determined that either: further improvements in positional registration between OIC and EIC are required, or the relative diffraction efficiency of the EIC and OIC is not optimal, then a second H2 resist master can be recorded with the exposure coordinates or the exposure energy modified accordingly.

Thus far reference has been made to the Shipley S1800 resist, which is the predominant resist used by originators of DOVIDS via optical interferometry techniques. Shipley S1800 resist is a positive working resist in that the solubility (within the linear part of its solubility versus exposure energy curve) increases proportionality with exposure energy. However it has been experimentally determined that the EIC surface relief, when recorded into a positive resist is not so faithfully replicated as the corresponding OIC—this contrast being most notable in those graphical components or elements within the EIC which have dimensions or line widths less than 50 microns and especially less than 20 microns. A typical example of such an EIC component will be what is known within the optical security industry as diffractive micro-text e.g. alpha numeric characters or indicia with font or character heights less than 200 micrometers. This difference in the relative embossing efficacy of the optical and electronically recorded grating structures is due to the difference in the shape or profile of their respective surface reliefs.

Specifically, grating structures generated by process of optical interference (including those within a hologram, which is typically comprised of a complex coherent superstition of gratings) are essentially sinusoidal in shape or profile. Since the amplitude of the grating profile (ca $\leqq 0.1$ micrometers) is typically less than a tenth of the grating pitch (normally between 0.7 and 1.4 micrometers), the slopes of these sinusoid gratings will have fairly gentle gradients (typically $\leqq 35°$) and relief maxima and minima with large radii (>grating pitch). Consequently optical interference gratings are relatively shallow open relief structures, readily replicated by the level of visco-elastic deformation of the embossed lacquer that occurs for typical embossing nip pressures (1-10 Nmm$^{-2}$) and lacquer temperatures (145-175° Celsius).

Conversely electron beam originated structures will be characterised by having a relief structure which in positive resist approximates to a periodic pattern of steep sided rectangular 'binary' pits wherein the base of each pit may be wider than opening at the top due to diffusion and defocus of the electron beam. The faithful replication or embossing such structures is in rheological terms much more challenging in that it requires the embossed lacquer to be in a state of viscous flow rather than in a visco-elastic state and to prevent any subsequent relaxation of the embossed structure it is necessary that the lacquer be rapidly cooled to below its glass transition temperature, as it exits the embossing nip.

In order to reduce the technical challenge associated with the efficient replication of electron beam surface relief microstructure two approaches can be taken:

The first is to use a negative resist, characterised by having photochemical behaviour which is the reverse of a positive resist in that the effect of exposure by actinic radiation (400-460 nm) is to generate a chemical cross-linking or photopolymerisation effect which causes the exposed areas to become increasingly insoluble with exposure energy. A suitable negative resist would be one with a low contrast ratio ($\gamma$<4).

An example of a negative resist is AZ(r) nLOF(tm) 2000 Photoresist supplied by Clariant—AZ Electronic Materials. This contains PGMEA (2-methoxy-1-methylethylacetate) as the solvent. The resin cross links when exposed.

Since a sinusoid profile is symmetric under inversion, the use of a negative resist will have little impact on the embossing characteristics of surface relief recorded by the process of optical interference. However using a suitable negative photo-resist in electron beam lithography allows the generation of more 'open' grating structures with a more trapezoidal or sinusoidal profile which are more inherently suitable for the embossing process.

As an alternative, we propose a second novel method for addressing the relief profile issues associated with electron beam gratings for the case where it is preferred to work with a particular positive resist due its optimal combination of sensitivity, contrast and resolution. The proposed solution is to conduct the foil embossing process (that is to emboss into a lacquer or similar material provided on a carrier film) with nickel stampers (usually referred to within the industry as embossing shims) which are the conjugate or negative of the H2 resist master. The use of a negative stamper means we emboss or impress into the hologram or OVD layer a relief structure 70 which is conjugate or reverse of that present within the resist master 71 as illustrated in FIG. 6.

To understand what affect the use of negative or conjugate embossing shims have on the origination process, it should be noted that in a conventional DOVID (whether that be in the form of a hot-stamped foil or a tamper evident label) the observed diffractive image is identical to that present within the H2 resist master.

For purpose of illustration, consider a DOVID which has an image comprised at least in part of the letter R 72 (FIG. 11). Hitherto it has been the practice within DOVID origination to record a H2 resist master (shown in plan at 73A and in cross-section at 73B) with the letter R appearing with the same sense or orientation. A nickel master 74A,74B is grown from the H2 resist master 73A,73B and then embossing shims 75A,75B are grown from the nickel master 74A,74B. Both the H2 master 73A,73B and embossing shim 75A,75B are referred to as having positive or 'correct-reading' images as can be seen at 73B,75B. Now since in an applied DOVID 76A,76B the embossed surface relief faces into the substrate to which the DOVID is applied, this means the 'hologram' layer must be embossed with a 'correct reading' embossing shim, leading to the electroplating sequence shown of FIG. 11 from which it is clear that the surface relief structure present within the embossing shim 75A,75B will be identical to that present within the H2 master resist 73A,73B (irrespective of whether that photoresist is positive or negative working).

The new approach is to depart from this industry practice by embossing the foil with a surface relief which is the conjugate of that recorded into the H2 resist master. Specifically for the case where a positive photo-resist from an operational perspective is very much the preferred working material, the proposed method will seek to nullify the replication concerns associated with e-beam grating structure recorded in positive photo-resist. The concept is to record the H2 (positive) resist master 80A,80B (FIG. 12) with image artwork 81, which is the conjugate or negative (mirror reverse) of that present in the final applied DOVID 82A,82B as can be seen by comparing 80B and 82B. To avoid confusion by applying term conjugate or the terms positive and negative to both artwork and photo-resist we shall refer the term conjugate artwork as 'wrong-reading'. FIG. 12 shows the process for delivering our requirement, wherein we begin by originating a H2 resist master 80A,80B wherein the artwork 81 for both the OIC and the EIC are recorded 'wrong reading' into the positive photo-resist. This wrong-reading H2 resist master 80A,80B is first vacuum coating with silver to be made conductive, and is then processed according to the electroplating sequence shown in FIG. 12 by successively growing two nickel masters 83A, 83B;84A,84B and then the embossing shims 85A,85B such that we generate embossing shims 85A,85B with 'correct reading' artwork but which have microstructure which is the conjugate of that present in the H2 master 80A,80B comprised of positive resist. In effect the embossing will from a microstructure perspective be equivalent to that generated by H2 master comprised of negative resist thus generating an EIC which is more readily embossed or replicated.

The invention claimed is:

1. A method of forming a security device, the method comprising
   a) providing an undeveloped photoresist layer on an electrically conductive layer;
   b) forming a first diffractive pattern in the undeveloped photoresist layer using optical-interferometry;
   c) forming a second diffractive pattern in the undeveloped photoresist layer using electron beam lithography; and
   d) thereafter developing the photoresist layer.

2. A method according to claim 1, wherein step c) is carried out after step b).

3. A method according to claim 1, wherein the electrically conductive layer comprises chrome.

4. A method according to claim 1, wherein step (b) comprises transferring a transmission hologram onto the photoresist layer.

5. A method according to claim 1, wherein the second diffractive pattern is defined by one or more diffraction gratings.

6. A method according to claim 5, wherein portions of the second diffractive pattern are spaced apart across the device with the orientation of the diffraction grating corresponding to each portion progressively changing.

7. A method according to claim 6, wherein the portions define lines.

8. A method according to claim 1, wherein the second diffractive pattern defines one or more lines with widths in the range 20-100 microns.

9. A method according claim 1, wherein portions of the second diffractive pattern are formed in spaces between portions of the first diffractive pattern.

10. A method according to claim 9, wherein the spaces between portions of the first diffractive pattern have widths greater than 150 microns.

11. A method according to claim 1, wherein portions of the second diffractive pattern define indicia such as alphanumeric characters.

12. A method according to claim 11, wherein the indicia have heights in the range 5-50 microns.

13. A method according to claim 1, wherein the photoresist layer is a positive photoresist.

14. A method according to claim 1, wherein step (c) is carried out while the electrically conductive layer is connected to earth.

15. A method according to claim 1, wherein the electrically conductive layer extends to an edge of the photoresist layer.

16. A method according to claim 1, wherein the electrically conductive layer acts as an absorbing anti-reflective layer.

17. A method according to claim 1, wherein the electrically conductive layer is provided with an anti-reflective coating.

18. A method according to claim 1, further comprising using the security device to form a die or shim.

19. A method according to claim 18, comprising carrying out steps (b) and (c) with reverse reading artwork; growing a first copy from the security device; growing a second copy from the first copy; and growing the die or shim from the second copy.

20. A method according to claim 18, further comprising applying the die or shim to a substrate so as to create a surface relief microstructure in the substrate corresponding to the security device.

21. A method according to claim 20, wherein the substrate comprises a label.

22. A method according to claim 21, further comprising subsequently adhering the label to a security document or article.

23. A method according to claim 20, wherein the substrate is provided on a carrier and is subsequently transferred to a security document or article.

24. A method according to claim 20, wherein the substrate comprises a security document or article.

25. A method according to claim 21, wherein the security document or article comprises a banknote, cheque or travellers cheque, certificate of authenticity, stamp, bond, tax disc, fiscal stamp, secure label, passport or voucher, identity card and the like.

* * * * *